March 18, 1969 H. SCHLOSSHAUER ETAL 3,434,017

SEMICONDUCTOR DEVICE

Filed Aug. 25, 1964

INVENTORS
Herbert Schlosshauer &
Horst Wahl
BY George H. Spencer
ATTORNEY 3,434,017
Patented Mar. 18, 1969

3,434,017
SEMICONDUCTOR DEVICE

Herbert Schlosshauer, Ulm, Danube, and Horst Wahl, Neu-Ulm, Danube, Germany, assignors to Telefunken A.G., Berlin-Charlottenburg, Germany Continuation-in-part of application Ser. No. 99,398, Mar. 30, 1961. This application Aug. 25, 1964, Ser. No. 394,375
Claims priority, application Germany, Apr. 2, 1960, T 18,182
U.S. Cl. 317—234 4 Claims
Int. Cl. H01l 5/00

The present invention relates to semiconductor diodes, especially for high frequencies, this application being a continuation-in-part of our co-pending application Ser. No. 99,398, filed Mar. 30, 1961, now abandoned.

The quality factor of high-frequency diodes, and especially of capacitance-variation diodes, is known to depend not only upon the value of over-all resistance but also upon the capacitance of the alloyed electrode. The smaller the product of the overall resistance R and the capacitance C, the more suitable the diodes are for high-frequency applications. This resistance is primarily determined by the spacing of the electrodes and the doping of the semiconductor body. Thus to achieve a small resistance, the semiconductor body must be strongly doped with impurities of the desired conductivity type. In addition, the electrodes must be spaced as closely as possible. This, and especially the reduction of the barrier-layer capacitance necessary for a small RC value, is achieved according to the invention by the provision of a semiconductor body which consists of a recrystallization zone of the first conductivity type and a semiconductor zone of the second conductivity type. The semiconductor zone of the second conductivity type is located in front of the recrystallization zone of the first conductivity type in such a way that a p-n junction exists only between the alloyed front and the contiguous semiconductor zone.

Etching treatments on semiconductor bodies are known in the prior art, but these processes were used exclusively for the purpose of eliminating foreign matter in the region on the p-n junction and where alloyed electrodes penetrate the surface. Heretofore unknown, however, was an etching treatment wherein all semiconductor material of the semiconductor body is etched away except for a residual zone located directly at the recrystallization zone.

Such a device may be produced, for example, by alloying an electrode into a semiconductor body and thereupon treating the body, preferably by etching, in such a way as to leave semiconductor material only between the frontal surface of the alloyed electrode and the semiconductor surface abutting the alloyed electrode. In this case, the thickness of the base zone is determined by the alloying depth, that is to say, the smaller the base zone is to be made the deeper the alloying material has to be alloyed into the semiconductor body, and vice versa.

The invention is based on the realization that good high-frequency diodes are achieved by deep alloying followed by etching treatment, wherein not only the semiconductor material in the region of the alloyed electrode adjacent to the semiconductor surface is etched away but also all semiconductor material not frontally abutting the alloyed electrode. After such an etching treatment, there remains only the part of the p-n junction directly aligned with the frontal surface of the alloyed electrode.

Thus, there is obtained a semiconductor diode which, in accordance with the present invention, comprises a semiconductor body of the first conductivity type with an ohmic electrode on one side and an alloyed electrode with a recrystallization zone of the second conductivity type on the opposite side of the body, the configuration of the semiconductor being such that the zone of the first conductivity type is confined to the region between the electrodes, in consequence of which the width of the zone of the first conductivity type is at least approximately equal to the width of the recrystallization zone of the second conductivity type. The semiconductor body is, for example, made of silicon, and the alloyed electrode of aluminum.

Additional objects and advantages of the present invention will become apparent upon consideration of the following description when taken in conjunction with the accompanying drawings in which.

Figure 1:
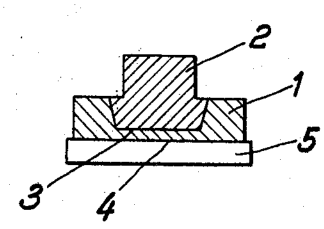
PRIOR ART Fig. 1
FIGURE 1 shows a cross-sectional view taken through a diode according to the prior art.
Figure 2:
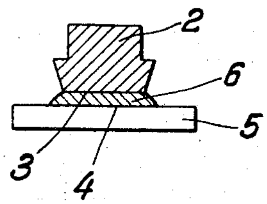
FIGURE 2 is a cross section taken through a diode according to the present invention.

The embodiment of the invention illustrated in FIGURE 2 shows a silicon diode which is obtained by making a diode from a starting body 1 of FIGURE 1, and alloying into this starting body 1 an aluminum wire 2 penetrating so deeply that the distance between the alloying front 3 of the aluminum electrode and the opposite semiconductor surface 4 of the base electrode 5 mounted on this semiconductor surface becomes as small as possible. The alloying step may be carried out in any suitable manner known per se; see, for example, Biondi's Transistor Technology, D. Van Nostrand Company, Inc., New York, 1958, vol. III, pp. 164 and 165. As is further shown in FIGURE 2, after the alloying step is finished, all silicon not located directly in the frontal zone between the alloyed electrode and the base electrode 5 is etched away, in contrast to the prior-art device according to FIGURE 1 where the perimeter semiconductor material remains.

The use of a relatively thick starting body 1 is necessary because aluminum has a tendency, even at normal alloying temperatures, to penetrate deeply. With a thin semiconductor plate as the starting body there would thus be the danger of alloying completely through. If, on the other hand, lower alloying temperatures were chosen, one would have to expect unwetted spots and the defects resulting therefrom in the zone of the alloying front.

The etching treatment proposed for making a diode according to the invention offers the advantage of considerably lower capacitances, as compared with the known device, shown by way of example in FIGURE 1.

Due to the fact that after the etching treatment of the semiconductor body 1, originally about 200 microns thick, semiconductor material 6 remains only in the space between the face of the alloyed electrode 2 and the parallel semiconductor surface 4 opposing it, and all silicon semiconductor material which remained around the perimeter of the electrode 2 has been etched away, the capacitance of the alloyed electrode has been lowered from 35 to 10 $\mu\mu f.$, and the RC factor has been reduced accordingly.

The aluminum wire 2 is alloyed into the semiconductor body, originally about 200 microns thick, so far as to result in a distance of 5–10 microns between the alloying front and the semiconductor surface 4 opposing the alloyed electrode. Since the diameter of the aluminum wire is 0.4 mm., the semiconductor body of the finished diode according to FIGURE 2 consists of a cylindrical semiconductor structure with a diameter of about 0.4 mm.

Simultaneously with producing this above-mentioned alloyed electrode an alloyed contact, free of a barrier layer is also alloyed onto the semiconductor surface 4 opposing the alloyed electrode 2.

The following is a specific illustrative example of a process for making a diode in accordance with the present invention. The starting body is a small disc of silicon, having a diameter of 1.4 millimeters and a thickness of 190 microns. An aluminum wire, having a diameter of 0.4 millimeters and a length of about 5 millimeters is alloyed into one of the faces of the disc, at an alloying temperature of approximately 700° C. The alloying time is approximately 12 to 14 minutes. The semiconductor body is then etched until a small portion is left between the alloying front and the opposite electrode. The etching is carried out for approximately 13 minutes, the etching mixture being constituted of hydrofluoric acid and nitric acid, the ratio of the hydrofluoric acid to nitric acid being 1:4. The resulting diode is one which is so configured that the zone of the first conductivity type, which is the conductivity type of the starting body, is confined to the region between the two electrodes, in consequence of which the width of the zone of the first conductivity type is at least approximately equal to the width of the recrystallization zone of the second conductivity type. The semiconductor body of the finished diode is generally cylindrical and has a diameter of about 0.4 milimeters, and the distance between the alloying front and the ohmic electrode is between approximately 5 and 10 microns.

It will be understood that the above description of the present invention is susceptible to various modifications, changes, and adaptations, and the same are intended to be comprehended within the meaning and range of equivalents of the appended claims.

What is claimed is:

1. A high-frequency semiconductor diode comprising: a semiconductor body of the first conductivity type with an ohmic electrode on one side and an alloyed electrode with a recrystallization zone of the second conductivity type on the opposite side of the body, the configuration of said semiconductor body being such that the zone of said first conductivity type is confined to the region between said two electrodes and the width of said zone of said first conductivity type is, throughout its entire extent, approximately equal to the width of the recrystallization zone of said second conductivity type.

2. A diode as defined in claim 1 wherein said semiconductor body is made of silicon.

3. A diode as defined in claim 1 wherein said alloyed electrode is made of aluminum.

4. A diode as defined in claim 1 wherein said semiconductor body is a generally cylindrical element having a diameter of approximately 0.4 millimeters and wherein the distance between the alloying front and said ohmic electrode is between approximately 5 and 10 microns.

References Cited

UNITED STATES PATENTS

| | | | |
|---|---|---|---|
| 3,140,527 | 7/1964 | Valdman | 29—25.3 |
| 2,903,628 | 9/1958 | Giacoletto | 317—234 |
| 3,197,839 | 8/1965 | Tiemann | 29—25.3 |
| 3,200,017 | 8/1965 | Pell | 148—33 |
| 3,088,888 | 4/1963 | Leff | 204—143 |
| 2,849,664 | 8/1958 | Beale | 317—234 |
| 2,989,671 | 6/1961 | Barnes et al. | 317—242 |
| 2,878,432 | 3/1959 | Armstrong | 317—240 |

FOREIGN PATENTS

| | | |
|---|---|---|
| 1,217,793 | 12/1959 | France. |

JOHN W. HUCKERT, *Primary Examiner.*

M. EDLOW, *Assistant Examiner.*

U.S. Cl. X.R.

317—234